United States Patent [19]

Shinriki et al.

[11] Patent Number: 5,292,673
[45] Date of Patent: Mar. 8, 1994

[54] METHOD OF MANUFACTURING A SEMICONDUCTOR DEVICE

[75] Inventors: Hiroshi Shinriki; Masayuki Nakata; Kiichiro Mukai, all of Tokyo, Japan

[73] Assignee: Hitachi, Ltd, Chiyoda, Japan

[21] Appl. No.: 883,531

[22] Filed: May 15, 1992

Related U.S. Application Data

[63] Continuation of Ser. No. 561,602, Aug. 2, 1990, abandoned.

[30] Foreign Application Priority Data

Aug. 16, 1989 [JP] Japan ................... 1-210071

[51] Int. Cl.$^5$ ................. H01L 21/336; H01L 21/28; H01L 21/285
[52] U.S. Cl. ........................ 437/42; 437/44; 437/235; 437/238; 437/239
[58] Field of Search ............ 437/40, 41, 44, 235, 437/238, 228, 236, 237, 239

[56] References Cited

U.S. PATENT DOCUMENTS

| | | | |
|---|---|---|---|
| 3,795,976 | 3/1974 | Ikeda | 437/238 |
| 4,356,623 | 11/1982 | Hunter | 437/44 |
| 4,462,863 | 7/1984 | Nishimatsu et al. | 156/643 |
| 4,495,219 | 1/1985 | Kato et al. | 427/235 |
| 4,844,767 | 7/1989 | Okudaira et al. | 156/643 |
| 4,992,136 | 2/1991 | Tachi et al. | 156/643 |

OTHER PUBLICATIONS

Tsang et al., "Fabrication of High-Performance LDDFET's With Oxide Sidewall-Spacer Technology", IEEE Trans. on Electron Devices, vol. ED-29, No. 4, Apr. 1982, pp. 590-596.

Ghandhi, *VLSI Fabrication Principles*, John Wiley and Sons, 1983, pp. 353-354, 512-514.

*Primary Examiner*—Mary Wilczewski
*Attorney, Agent, or Firm*—Antonelli, Terry, Stout & Kraus

[57] ABSTRACT

When a MOSFET containing a tantalum pentoxide film as a gate insulating film is formed, ion implantation is applied such that the end of an insulating film containing a tantalum pentoxide film situates to the outside of a gate electrode to thereby form source and drain regions. This can effectively prevent troubles such as short-circuitting due to tantalum pentoxide film and a highly reliable MOSFET can be obtained without applying light oxidation.

42 Claims, 11 Drawing Sheets

METHOD OF MANUFACTURING A SEMICONDUCTOR DEVICE

This application is a continuation application of application Ser. No. 07/561,602, filed Aug. 2, 1990, now abandoned.

BACKGROUND OF THE INVENTION

The present invention concerns a method of manufacturing a semiconductor device and, more in particular, it relates to a method of manufacturing a field effect transistor (hereinafter referred to as MOSFET) using a film of transition metal oxide as a gate insulating film.

In manufacturing a MOSFET, after patterning a gate electrode and a gate insulating film into a predetermined shape, the surface of a substrate or polysilicon gate electrode has been slightly oxidized before the formation of source and drain as is well-known in the prior art.

Since edges of the gate insulating film suffers from damages caused by etching, the above-mentioned oxidation step is applied for recovering the damage and prevent the occurrence of leak current and failure of voltage withstanding and this is an indispensable step, being referred to as "light oxidation".

However, if a film of transition metal oxide such as a tantalum pentoxide film is used as the gate insulating film, the rate of oxygen diffusing in the film of such material is much greater than that in silicon dioxide used so far. Accordingly, when a tantalum pentoxide film 2, a silicon dioxide film 3, a tungsten film 4 and a PSG (phosphosilicate glass) film 5 are formed in lamination on a silicon substrate 1 applied with patterning and then light oxidation as shown in FIG. 1a, oxygen diffuses from the exposed edges to the inside of the gate insulating films 2,3 to oxidize the semiconductor substrate 1 and the gate electrode 4 present above and below thereof respectively. As a result, a wedge-like oxide layer 101' is formed at the edge of the gate region as shown in FIG. 1b. This phenomenon is remarkable in a case where streams are contained in an oxidizing atmosphere upon applying light oxidation. As a result, this causes a problem that an inversion voltage is increased in a channel region at a portion in which the wedge-like oxide layer 101' is formed to increase a threshold voltage. It is difficult to completely prevent this phenomenon even by forming an oxide film 5' on the side wall of the gate 2 as shown in FIG. 1c.

It has further been found that when the transition metal oxide film 2 as the gate insulating film is patterned simultaneously with the formation of the gate electrode 4, a leak current tends to flow through the edge of the gate insulating film 2. Further, as shown in FIG. 2a, if oxidation is applied in a state where a gate insulating film 23 is exposed at the outside of a gate electrode 24, oxygen diffuses from the exposed portion to the inside of the gate insulating film 23 to oxidize a semiconductor substrate 21 or the gate electrode 24 present below and above thereof to form wedge-like oxide layers 28, 28' at the end of the gate region as shown in FIG. 2b. This results in a problem that an inversion voltage is increased at a channel region of MOSFET in a portion where the wedge-like oxide layers 28, 28' are formed to increase the threshold voltage.

In FIGS. 2a, 2b, denoted at 22 is a thick insulating film for inter-device isolation and at 23' an insulating film formed by the oxidation of the surface of the gate electrode 24.

In recent years, the width of the gate electrode in MOSFET has been narrowed extremely and a MOSFET having a gate electrode with width of 0.2 μm or less has been proposed. Then, if wedge-like oxide layers should be formed below such a fine gate electrode, it is apparent that the operation as the MOSFET is scarcely possible.

SUMMARY OF THE INVENTION

It is, accordingly, the object of the present invention to overcome the foregoing problems in the prior art and provide a method of manufacturing a semiconductor device capable of producing an extremely fine MOSFET having high reliability.

Another object of the present invention is to provide a method of manufacturing a semiconductor device capable of easily producing a fine MOSFET having a film of transition metal oxide with high dielectric constant such as $Ta_2O_5$ as an gate insulating film.

For attaining the foregoing objects, in accordance with the present invention, a gate electrode is formed by removing unnecessary portions of a conductive film by means of a well-known etching, and then ion implantation is applied to form source and drain regions without applying light oxidation, while leaving an insulative film for gate insulating film formed below and outside of the conductive film.

The insulative film for the gate insulating film may be left entirely without removal and ion implantation may be conducted through the insulative layer, or the insulative film for the gate insulating film may be patterned such that it left not only just below the gate electrode but also left partially at the outside of the gate electrode. That is, source and drain regions are formed by conducting ion implantation, without applying light oxidation, in a state where the outer periphery of the insulative film extends to the outside of the edge of the gate electrode by making the insulative film for the gate insulating film larger than the gate electrode.

In a case of forming a MOSFET of a so-called LDD (lightly doped drain) structure, the gate electrode is formed as described above, an insulative film is selectively formed on the side wall of the gate electrode in a state where the insulative film for the gate insulating film is left not only just beneath of the gate electrode but also at the outside of the gate electrode, and then ion implantation is conducted to form source and drain regions. Also in this case, light oxidation is not taken place and the ion implantation is usually conducted through the thin insulative film deposited on the substrate.

Since sufficient reliability can be obtained without applying light oxidation by leaving the gate insulating film also to the outside of the gate electrode, light oxidation is no more necessary. Further, in a case of forming an MOSFET of LDD structure by forming an insulative film on the side wall, since ion implantation is conducted while forming a deposition layer on a region in which source and drain regions are formed, contamination on the surface of the source and drain regions can be prevented and light oxidation is not required also in this case. In a case where ion implantation is conducted through the gate insulating film left to the outside of the gate electrode, since the gate insulating film is left also below the edge of the gate electrode, there is no problem for the occurrence of leak current. Further, in a case of forming an insulative film on the side wall of the gate electrode, since the gate insulating film is left below the insulative film formed on the side wall, the gate can be formed as a offset structure to suppress the increase of the leak current.

Further, by using an insulative film made of such material in which oxygen diffuses at a rate lower than that in the gate insulating film as the insulative film formed on the side wall of the electrode, since the concentration of the oxygen reaching the gate insulating film is reduced when exposed to an oxidizing atmosphere in the subsequent step, wedge-like oxidation is less proceeded.

DETAILED DESCRIPTION OF THE PREFERRED EMBODIMENTS

EXAMPLE 1

Figure 1A:
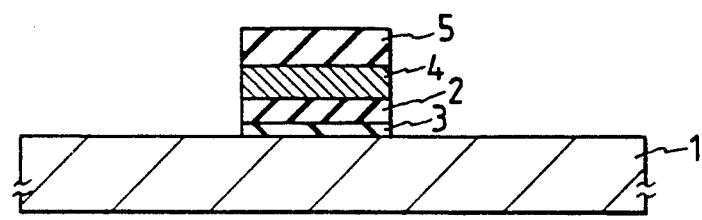
FIG. 1a through 1c, and FIGS. 2a and 2b are, respectively, step charts for illustrating problems in the conventional method of manufacturing semiconductor devices.
Figure 1B:
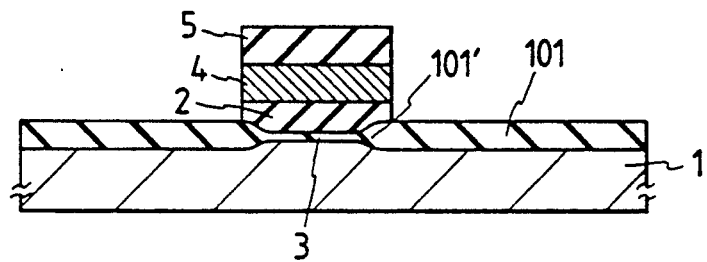
Figure 1C:
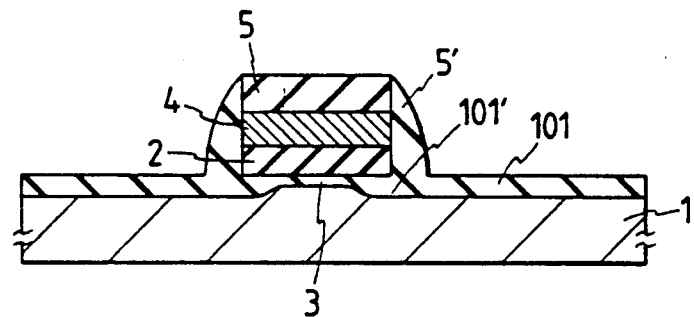
Figure 2A:
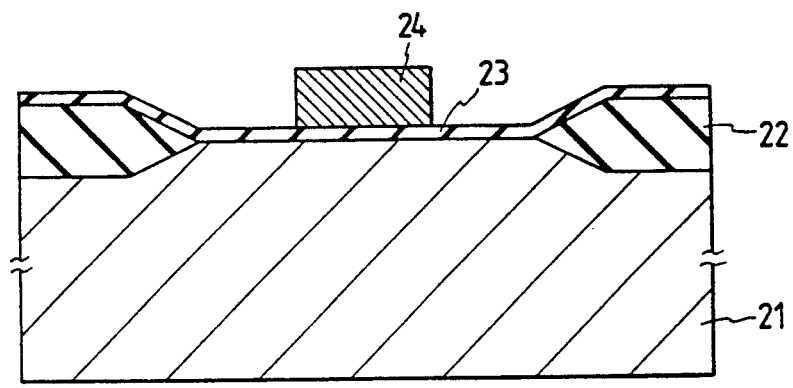
Figure 2B:
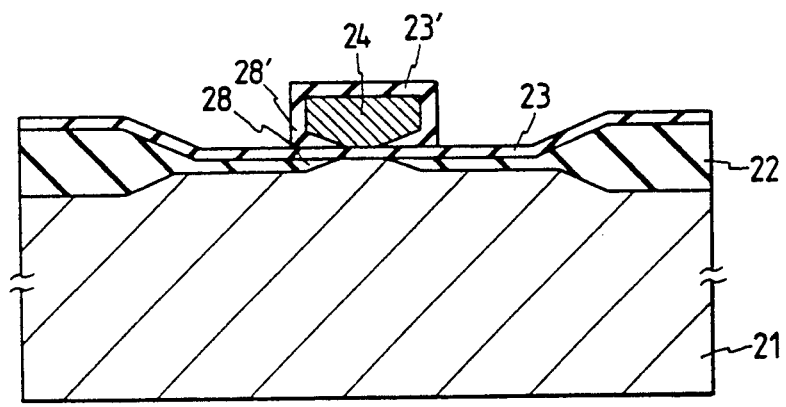
Figure 3A:
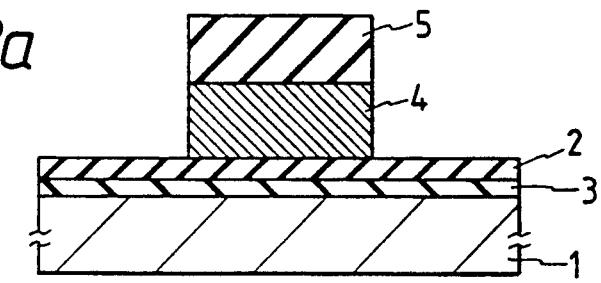
FIGS. 3a through 3c are step charts illustrating one embodiment of the present invention.
Figure 3B:
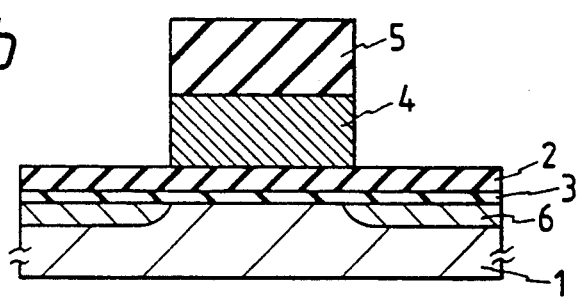

As shown in FIG. 3a, after forming a silicon dioxide film of 10 nm thickness by means of well-known thermal oxidation to the surface of a p-type silicon substrate 1, $BF_2$ was ion implanted to a channel region under the conditions at 40 Kev and $2.0\times 10^{12}cm^{-2}$. The silicon oxide film was removed by etching and a tantalum pentoxide film 2 of 20 nm thickness was formed as an gate insulating film by means of reactive sputtering. In this example, tantalum pentoxide was formed by using reactive sputtering, but it may also be formed by means of chemical vapor deposition by using a tantalum alkoxylate, or tantalum halide such as tantalum chloride or tantalum fluoride as a source gas. Then, a $SiO_2$ film 3 of about 2 nm thickness was formed between the silicon substrate 1 and the tantalum pentoxide 2 by a heat treatment at 800° C. in a dry oxygen atmosphere. A tungsten film 4 of 300 nm thickness was formed on the tantalum pentoxide film 2 by means of sputtering. Further, a PSG film 5 was formed on the tungsten film 4. Then, after removing an unnecessary portion of the PSG film 5 by means of etching, the exposed portion of the tungsten film 4 was removed by using the PSG film 5 as a mask to form a cross sectional shape as shown in FIG. 3a. Then, after implanted arsenic ions under the conditions at 40 kev and $5.0\times 10^{15}cm^{-2}$, an n-type highly doped region 6 was formed by a heat treatment at 900° C. in a nitrogen atmosphere to form source and drain regions as shown in FIG. 3b.

Figure 3C:
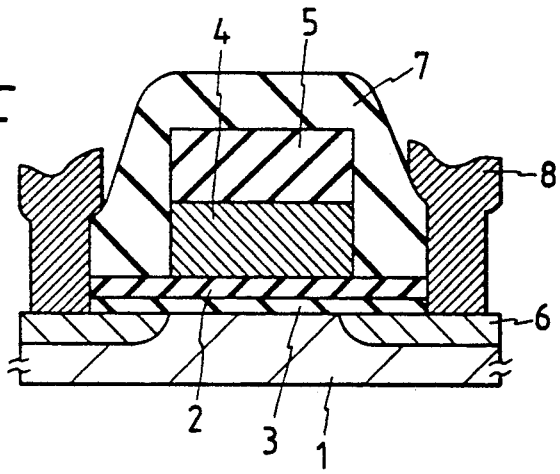

Further, after depositing a PSG film over the entire surface to form an interlayer insulating film 7, a contact hole was opened and a wiring metal film 8 was formed by well-known means to prepare a MOSFET as shown in FIG. 3c.

Figure 4A:
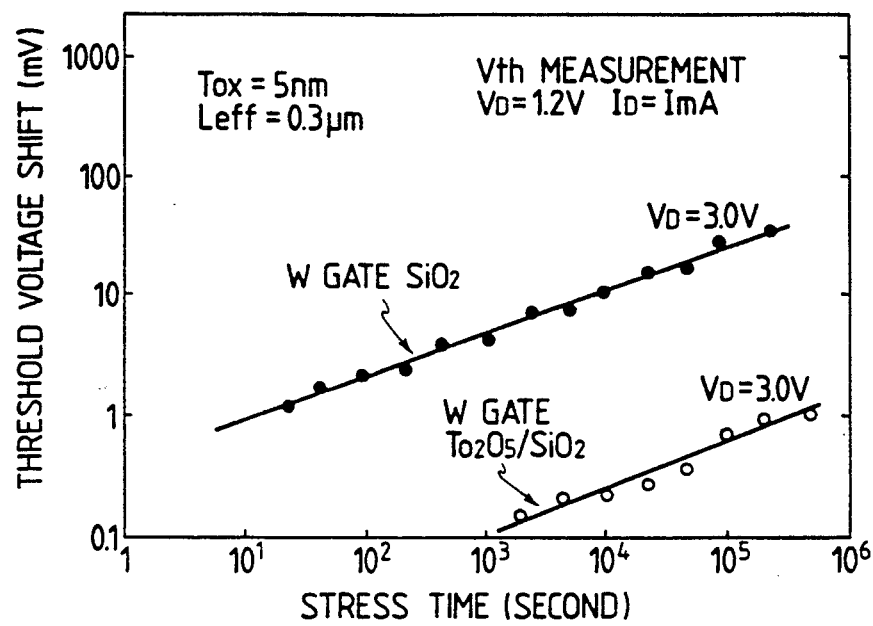
FIGS. 4a and 4b are graphs, respectively, showing the effect of the present invention.
Figure 4B:
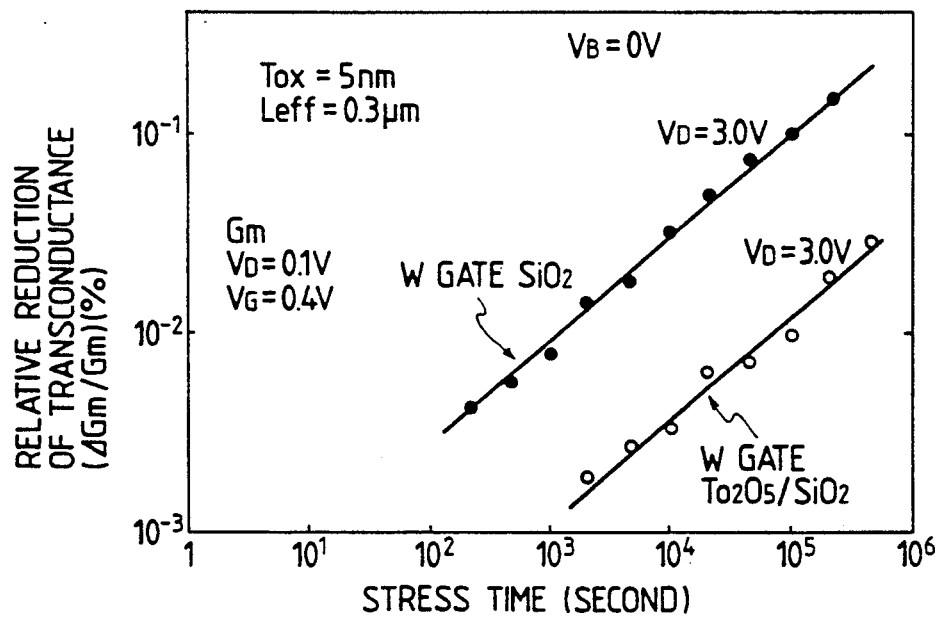

FIGS. 4a and 4b show the results for the comparison of the dependency of the shift amount of a threshold ($V_{th}$) voltage and the degradation of transconductance (Gm/Gmo) on the stress voltage application voltage in comparison between the MOSFET obtained in this example and a conventional MOSFET with 0.3 um of channel length having a silicon dioxide film of 5 nm thickness as a gate insulating film. As apparent from FIGS. 4a and 4b, fluctuations in both of the shift amount of the threshold voltage and the degradation amount of the transconductance could be reduced by more than one order of magnitude when using a laminate film comprising a tantalum oxide film and a silicon dioxide film as a gate insulating film. As a result, it can be found that an excellent reliability can be obtained in a MOSFET with the channel length of less than 0.3 um in accordance with the present invention.

EXAMPLE 2

Figure 5A:
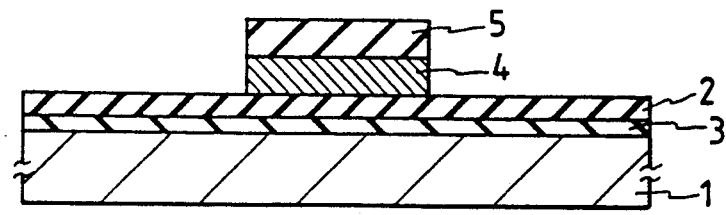
FIGS. 5a through 5d, FIGS. 6a through 6d, FIGS. 7a through 7c, FIGS. 8a through 8c and FIGS. 9a and 9b are, respectively, step charts illustrating different embodiments of the present invention.
Figure 5B:
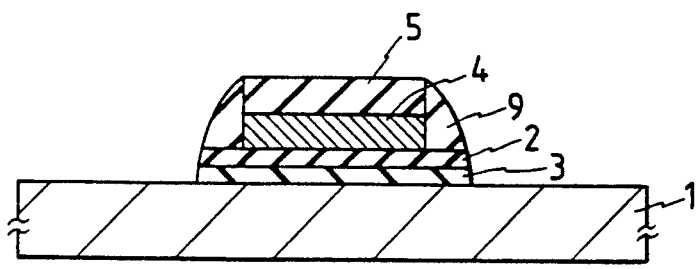
Figure 5C:
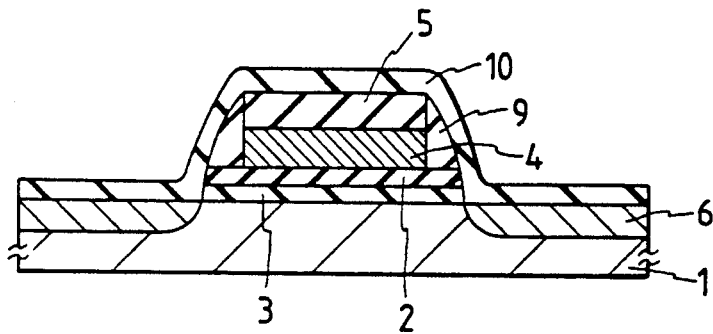
Figure 5D:
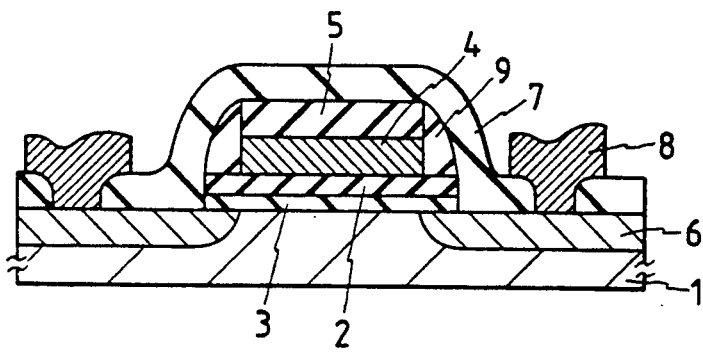

As shown in FIG. 5a, after forming a silicon dioxide film of 10 nm thickness to the surface of a p-type silicon substrate 1, $BF_2$ was ion implanted into a channel region under the conditions at 40 Kev and $2.0\times 10^{12}cm^{-2}$. Subsequently, the silicon dioxide film was removed and a tantalum pentoxide from 2 of 20 nm thickness was formed to the surface as a gate insulating film by means of reactive sputtering. The tantalum pentoxide film was formed by using reactive sputtering in this example, but it may be formed also by chemical vapor deposition (CVD), using tantalum alkoxylate or a tantalum halide (such as tantalum chloride or tantalum fluoride) as a source gas for tantalum in the CVD. Then, an $SiO_2$ film 3 of about 2 nm thickness was formed between the silicon substrate 1 and the tantalum pentoxide film 2 by applying a heat treatment at 800° C. in a dry oxygen atmosphere. Further, a tungsten film 4 of 300 nm thickness was formed by sputtering. Further, a PSG film 5 was formed on the tungsten film 4. Then, after removing an unnecessary portion of the PSG film 5, the exposed portion of the tungsten film 4 was etched by using the PSG film 5 as mask to obtain a cross sectional shape as shown in FIG. 5b. Then, after depositing a PSG film over the entire surface, an anisotropic etching was applied to the entire surface such that the portion formed on the side 9 was left while the PSG film deposited on other portions was removed to obtain a structure as shown in FIG. 5b. In this case, the exposed portions of the laminated film comprising the tantalum oxide 2 and the silicon dioxide film 3 were also removed simultaneously by etching. Then, a silicon dioxide film 10 was deposited to the entire surface by means of well-known CVD and then arsenic ions were implanted under the condition at 40 Kev and $5.0\times 10^{15}cm^{-2}$ and, further, a heat treatment was applied in a nitrogen atmosphere at a temperature of 900° C. to form an n-type highly doped region to form source and drain regions as shown in FIG. 5c. Further, an interlayer insulating film 7 was formed, a contact hole was opened and a wiring metal film 8 was formed in the same manner as in usual way to manufacture a MOSFET shown in FIG. 5d. When the dependency of the shift amount of the threshold voltage ($V_{th}$) and the degradation Δ Gm/Gmo of the transconductance on the stress voltage application time of the MOSFET obtained in this embodiment were compared with those of a conventional MOSFET with a channel length of 0.3 um having a silicon dioxide film of 5 nm thickness as a gate insulating film, each of the fluctuation amounts could be reduced by more than one order of magnitude in a case of using a laminated film comprising the tantalum film oxide and the silicon dioxide film like that in Example 1 and it could be confirmed that this is a MOSFET of excellent reliability. As the gate electrode, a film of high melting metal such as tungsten or molybdenum, a polysilicon film, a film of tungsten or molybdenum silicide, or a so-called polycide film in which a polysilicon film is formed below the silicide film described above can be used. In the case of using the mono-layer film of tungsten or molybdenum for the gate electrode, an insulative film is formed thereover for preventing channeling. However, in a case of forming the gate electrode by using other material, such a channeling-preventive film is not necessary.

EXAMPLE 3

In this example, a MOS transistor of LDD (lightly doped drain) structure was manufactured by conducting the manufacturing process shown in Example 1 and 2 in two steps.

Figure 6A:
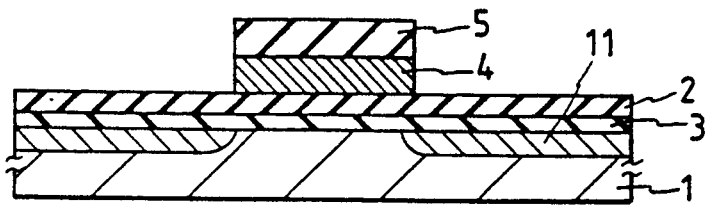
Figure 6B:
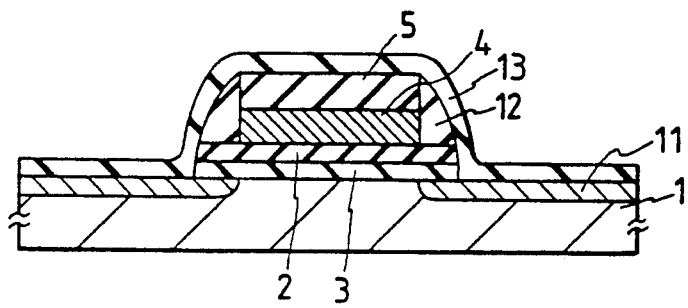
Figure 6C:
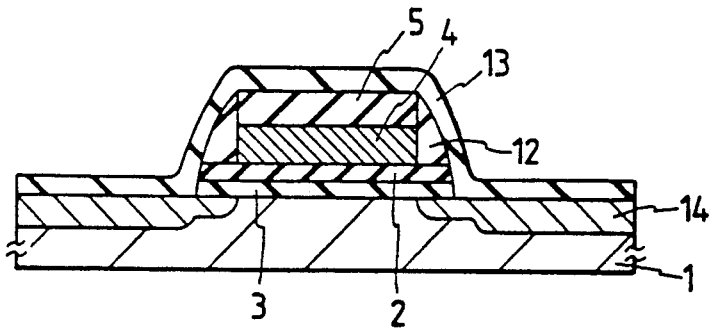
Figure 6D:
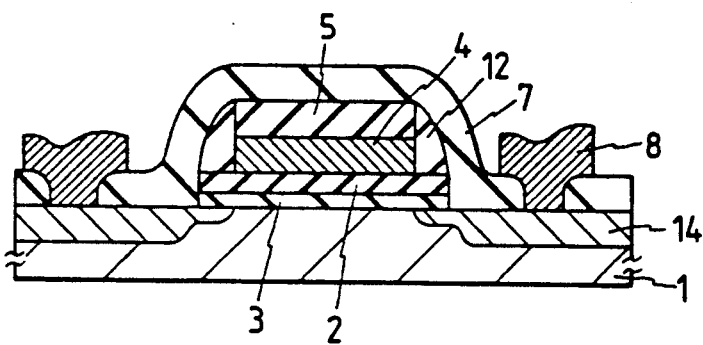

At first, a cross sectional structure shown in FIG. 6a was obtained by the process shown in Example 1. In this case, a first impurity doped region 11 was formed by implantation of arsenic ions at $2.0 \times 10^{13}$ cm$^{-2}$ for gate patterns 4, 5 by conducting ion implantation in a self-aligned manner. Then, an insulating film 12 was formed on the side of a gate electrode 4 by the process shown in Example 2. In this case, exposed portions of the laminated film comprising the tantalum oxide film 2 and the silicon dioxide film 3 were removed by etching simultaneously. Then, a PSG film 13 was deposited, to which arsenic ions were implanted under the condition at $5.0 \times 10^{15}$ cm$^{312}$ to form a second impurity doped region 14.

The second impurity doped region was formed by implanting impurities at a higher concentration under a sufficiently higher acceleration voltage than those for the first impurity doped region. Therefore, in the first impurity doped region, the impurity was doped at a sufficiently lower concentration and to a shallow region, whereas in the second impurity doped region, the impurity was doped at a sufficiently higher concentration and to a deep region to show excellent property as LDD.

EXAMPLE 4

The MOSFET of LDD structure can also be manufactured like that in Example 3 also by conducting the process shown in Example 2 by two steps. The manufacturing method is shown in FIGS. 7a through 7c.

Figure 7A:
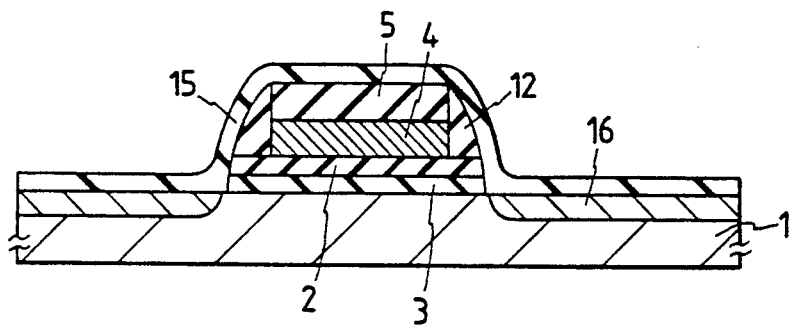
Figure 7B:
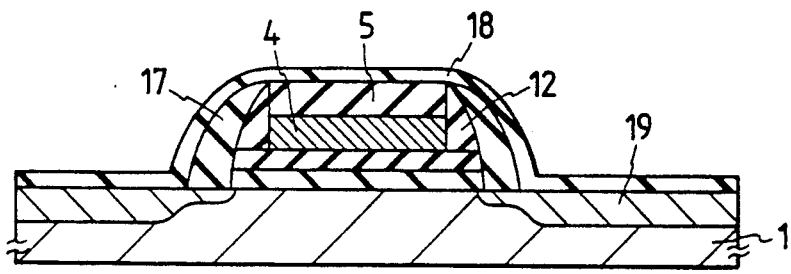
Figure 7C:
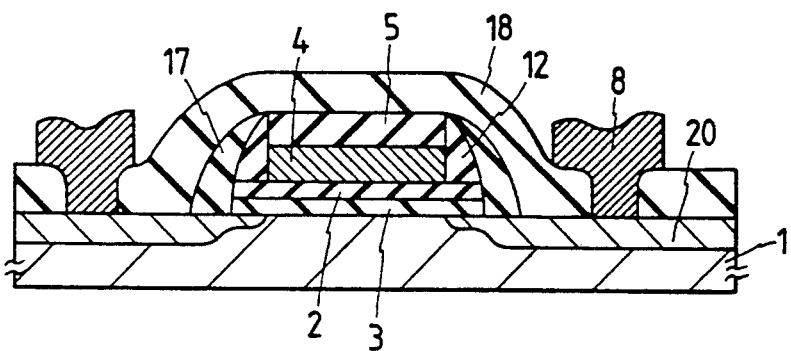

At first, a cross sectional shape shown in FIG. 7a was formed by the manufacturing method shown in Example 2. An n-type diffusion layer 16 was formed by implanting arsenic ions at $2.0 \times 10^{13}$ cm$^{-2}$ through a PSG film 15. Further, a second insulating film 17 was formed on the side of the gate electrode by depositing a PSG film and applying anisotropic etching to the entire surface. Further, after depositing a PSG film 18, arsenic ions were implanted at $5.0 \times 10^{15}$ cm$^{-2}$. Since the concentration for the amount of the ion implantation was set higher than that in the first ion implantation, a MOSFET of LDD structure could be formed in the same way as in Example 3. Further, the profile for source and drain 20 was optimized as shown in FIG. 7c by applying a heat treatment at 900° C.

EXAMPLE 5

Figure 8A:
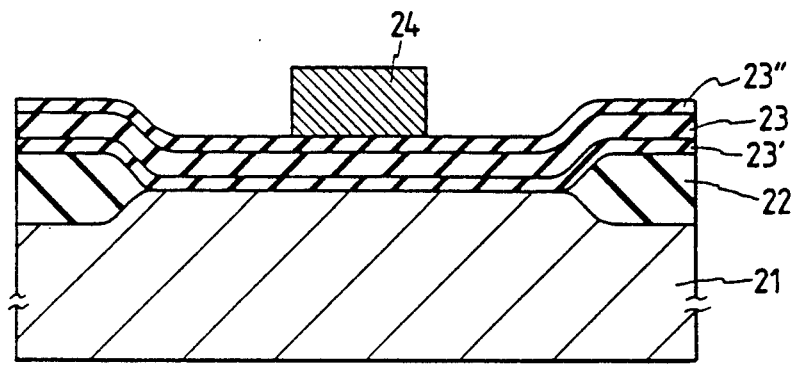
Figure 8B:
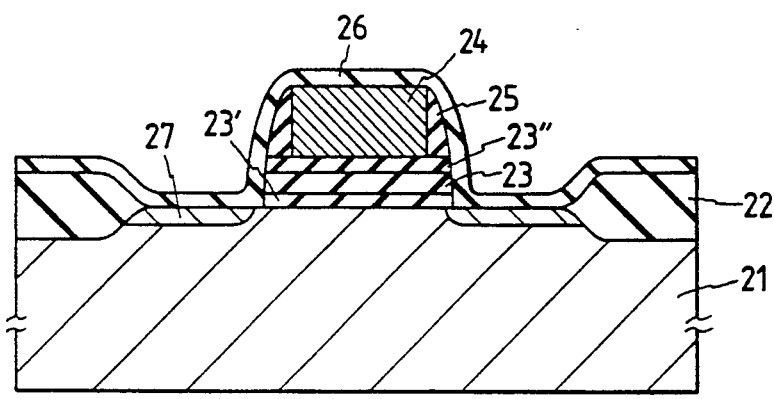

As shown in FIG. 8a, after forming a device isolation region 22 on the surface of a p-type silicon substrate 21 by means of well-known LOCOS, a tantalum pentoxide film 23 of 10 nm thickness was formed as a gate insulating film on the surface of a substrate 21 by means of reactive sputtering. In this embodiment, the tantalum pentoxide film was formed by using reactive sputtering, but it may also be formed by CVD using tantalum alkoxide or a tantalum halide such as tantalum chloride or tantalum fluoride as a source gas. Subsequently, heat treatment was applied in a dry oxygen atmosphere at 800° C. to form a silicon dioxide film 23' of about 5 nm thickness between the silicon substrate 21 and the tantalum pentoxide 23. A silicon dioxide film 23" of 10 nm thickness was formed by CVD on the tantalum pentoxide film 23 for preventing reaction between polysilicon and tantalum oxide film 23. A polysilicon film 24 of 300 nm thickness was further formed thereover by means of CVD and a high concentration phosphorus was doped into the polysilicon film 24 to form a gate electrode. Then, unnecessary portions of the polysilicon film 24 and the tantalum pentoxide film 23 were removed by etching to form a gate pattern. Patterning was applied for the polysilicon film 24 with microwave plasma etching using SF$_6$ gas and for the tantalum pentoxide film 23 with reactive sputter etching using CHF$_3$ respectively. After forming a silicon dioxide film 25 of 100 nm thickness as the first insulating film by means of CVD to the entire surface, anisotropic dry etching was applied to the entire surface of the silicon dioxide film 25 to leave only the portion of the silicon dioxide film 22 on the side of the gate and remove all other portions as shown in FIG. 8b. After forming a thin insulating film 26 on a region to be formed with source and drain regions by means of well-known thermal oxidation (dry atmosphere) or CVD, source and drain regions were formed by means of arsenic ion implantation and heat treatment in a nitrogen atmosphere at 950° C. The ion implantation was conducted at an acceleration voltage of 80 Kev and the source-drain region 27 could be formed in a self-aligned manner to the poloysilicon film 24.

Figure 8C:
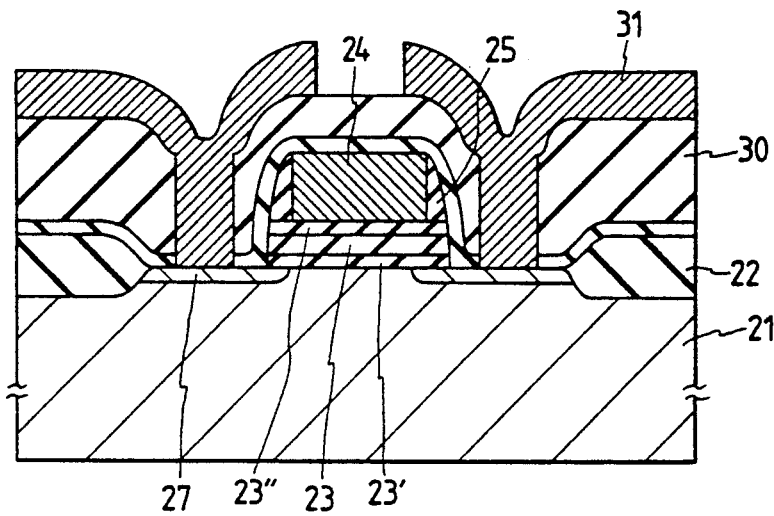

Further, an interlayer insulating film 30 was formed, a contact hole was formed, a contact hole was opened and metal wiring film 31 was formed by conventional means to manufacture a MOSFET shown in FIG. 8c.

The threshold voltage of the resultant MOSFET was 1.0 V and other electrical properties were also satisfactory.

In this example, CVD-SiO$_2$ film was used as a film for preventing reaction between polysilicon and tantalum oxide, but the same effect can also be obtained with films capable of preventing reaction such as Si$_3$N$_4$.

EXAMPLE 6

An LDD structure can be obtained by applying the step of forming insulating films on the side of the gate in Example 5.

Figure 9A:
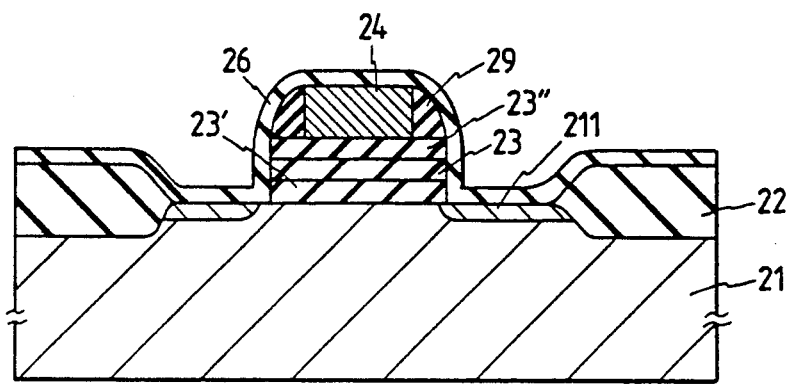
Figure 9B:
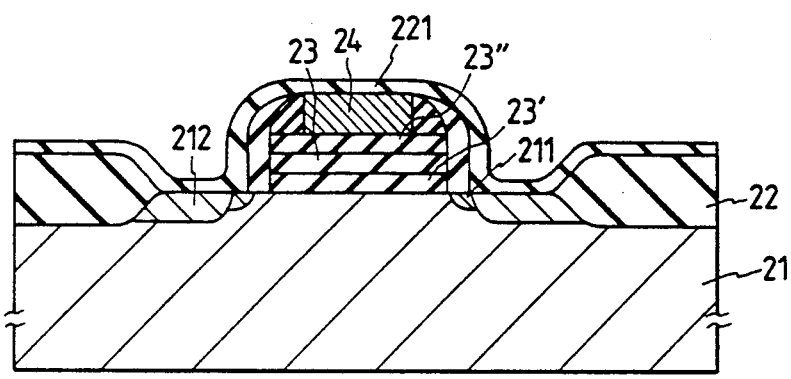
Figure 9C:
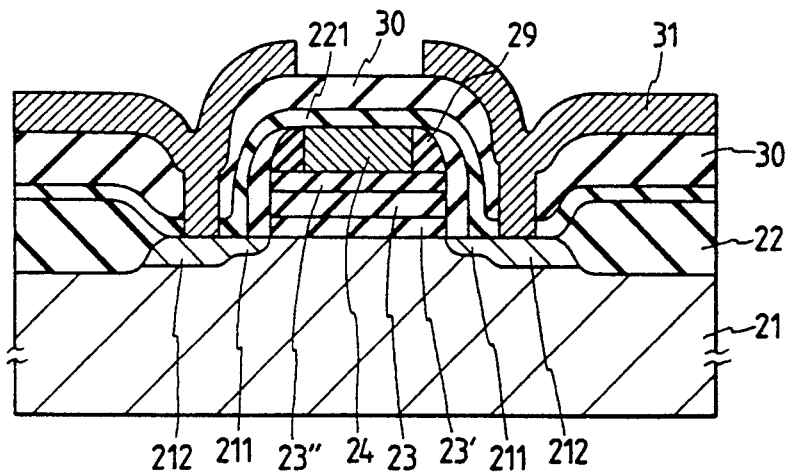

As shown in FIG. 9a, after forming an electrode 24, a first silicon dioxide film 29 was deposited to the entire surface and anisotropic dry etching was applied to remove the silicon dioxide film 29 while remaining only the portion formed on the side of the gate and eliminating all other portions. After thermally oxidizing the silicon substrate 21 to form a thin silicon dioxide film 26, first ion implantation was conducted thereto through the first silicon dioxide film 26 to form an impurity doped region 211. Alternatively, ion injection may be conducted penetrating the deposited silicon dioxide film by using CVD as in Example 2.

Further, deposition of the silicon dioxide film and the anisotropic dry etching for the entire surface were conducted once again to form a second silicon dioxide film 26 on the side of the gate and a CVD-SiO$_2$ film 221 was formed on the silicon substrate 21. Instead of the CVD-silicon dioxide film 221, an silicon dioxide film may also be formed to the surface of the silicon substrate by means of oxidation in a dry oxidative atmosphere. Ion implantation was conducted through the CVD-silicon dioxide film 221A to form a second impurity doped region 212. In this instance, an LDD structure could be formed by lowering the concentration in the first impurity doped layer 211 than that of the impurity doped layer 212.

EXAMPLE 7

In this example, a transistor formed in accordance with the present invention is applied to a dynamic random access memory comprising a transistor and a capacitor.

Figure 10:
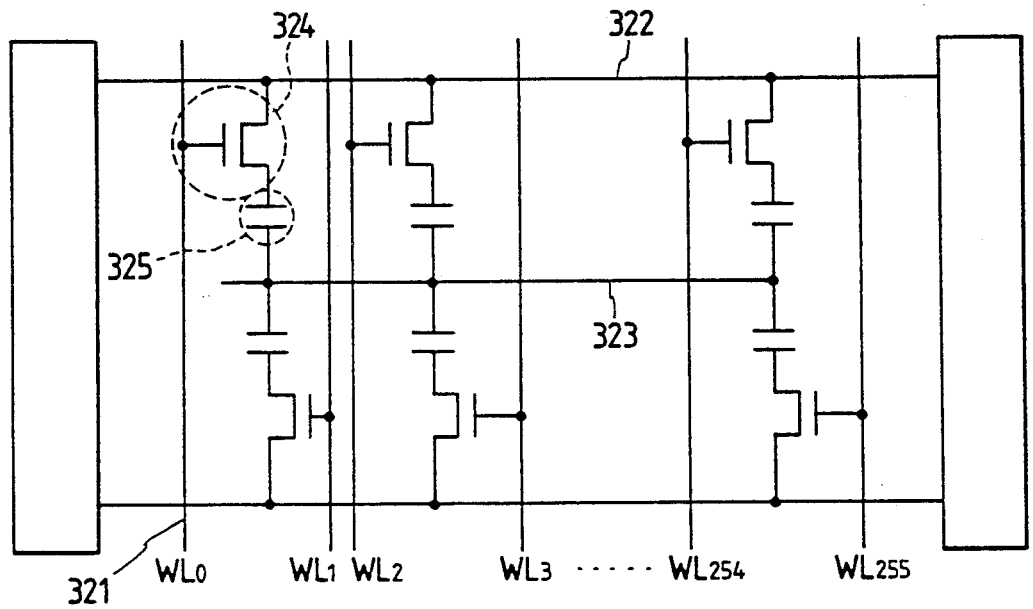
FIGS. 10 shows one example of a wiring diagram for a dynamic memory device including a MOSFET formed in accordance with the present invention.

FIG. 10 shows a method of wiring a memory array. Denoted at 324 is a transistor which is shown in any one of Examples 1 to 4 in which tungsten was used for the gate electrode. Further, denoted at 325 is a capacitor. The gate electrode is connected to one of word lines 321. Further, one of the electrodes of the transistor is connected to a bit line 322, while the other of the electrodes is connected with one of the electrodes of the capacitor 325. Further, the other electrode of the capacitor is connected to a plate potential.

Figure 11:
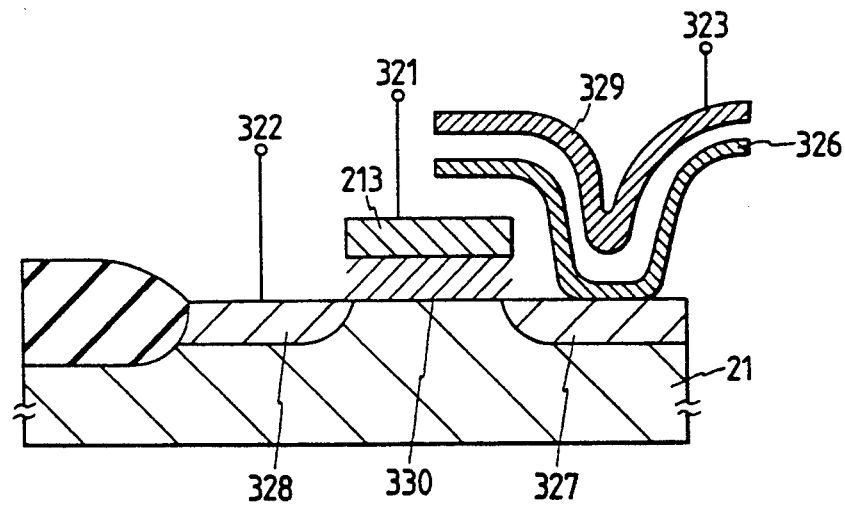
FIG. 11 shows one example of a cross sectional structure of a dynamic memory cell having a MOSFET formed in accordance with the present invention and FIGS. 12 and 13 are, respectively, graphs showing the effect of the present invention.
Figure 12:
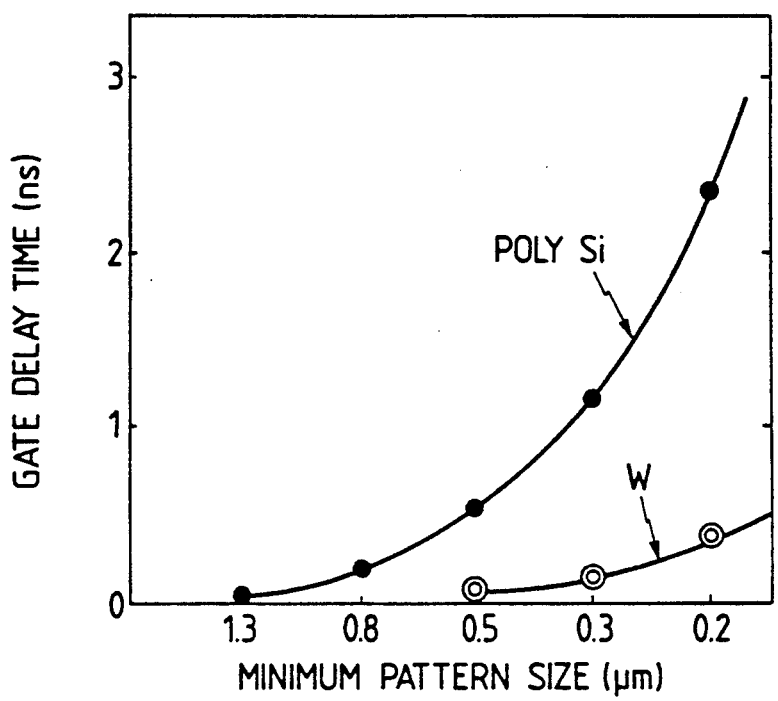

FIG. 11 schematically shows a cross sectional structure for one example of the memory cell, in which are shown a gate insulating film 330 formed by the method shown in Example 1, and one electrode 326 of the capacitor 325 connected to a highly doped impurity region 327. The other electrode 329 of the capacitor is connected with a plate potential 323. Further, a highly doped impurity region 328 is connected with a bit line 322. It has been found that the dynamic random access memory comprising the foregoing constitution has excellent function.

As shown in Examples 1–7, it has been found that the performance of the transistor formed in accordance with the present invention can provide excellent performance within a channel region of less than 0.3 um. Further, the improvement for the performance of a semiconductor memory using a great quantity of transistors is remarkable.

Figure 13:
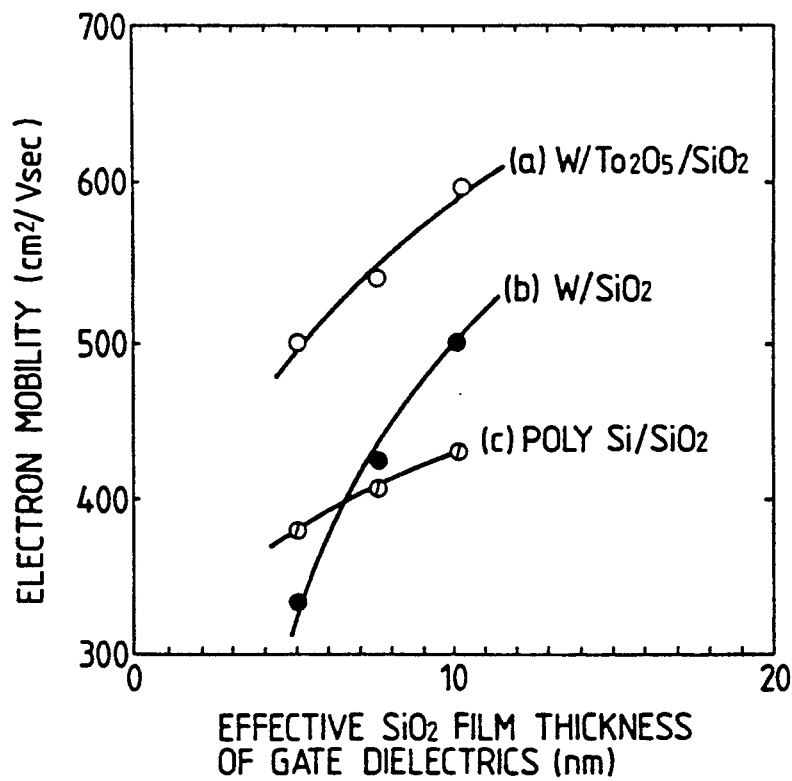

FIG. 13 shows the dependency of the mobility on the thickness of the gate insulating film obtained in the MOSFET(a) according to the present invention, the W/SiO$_2$ structure MOSFET(b) using SiO$_2$ as a gate insulating film and the MOSFET(c) using polysilicon as a gate electrode and SiO$_2$ as a gate insulating film. In this case, the channel doping amount is optimized for obtaining an identical V$_{th}$. Channel is doped to $10^{13}$ cm$^{-2}$ in the structure (c) while at $10^{11}$ cm$^{-2}$ for the structures(a) and (b). Under these conditions, if the thickness of the gate insulation film is 5 nm, the electron mobility obtained is 500 cm$^2$/Vsec for (a), 330 cm$^2$/Vsec for (b) and 380 cm$^2$/Vsec for (c). These results show that if the thickness of the SiO$_2$ gate insulating film is reduced in the structure (b), it gradually becomes impossible to prevent the diffusion of W to the Si substrate and the electro mobility is also degraded. On the other hand, in the structure (a), diffusion of W to Si substrate can be prevented by using Ta$_2$O$_5$ and satisfactory mobility can be obtained even when the thickness of the gate insulating film is 5 nm. Accordingly, it is possible to realize an operation speed greater about 30% as compared with the case of conventional polysilicon gate MOSFET and by 55% as compared with the case of using a W gate and using SiO$_2$ for the gate insulating film. Further, use of Ta$_2$O$_5$ as the gate is extremely effective for attaining a high speed CMOS device since it is less resistive while maintaining satisfactory electron mobility and the working function situates at the intermediate of the silicon band. In particular, the effect capable of using the W electrode is also extremely effective for the improvement of delayed speed.

FIG. 14 shows word line delay time of a memory device formed by using a transistor obtained in accordance with the present invention in comparison with a signal delay time of a word line of predetermined length in a conventional memory device in which polysilicon is used as a word line and an aluminum wiring is laid on the word line for avoiding the delay of the access time and connected at a predetermined interval. It has been found that a delay time shorter by about one order of magnitude can be obtained at a fabrication level of 0.2 um as compared with that of the prior art. Since the resistance of tungsten can be reduced as low as less than 1/20 compared with that of polysilicon and tungsten has a longer life than that of aluminum, even under supply of a great current density, access speed can be increased. Further, two sheets of masks required for the connection between aluminum and word line can be saved. Accordingly, by using the transistor of the present invention a highly integrated memory device, not only the reliability of the device can be improved but there attain effects of increasing the access speed due to the reduction of the word line delay and decreasing the number of steps by the reduction of the number of masks.

The following effects can be obtained not only in the case of applying the transistor according to the present invention to the dynamic random access memory (DRAM), but also in a case of applying the transistor according to the present invention for a memory cell such as a static random access memory (SRAM), a read only memory (ROM) and a non-volatile memory.

When manufacturing a field effect transistor by using a transition metal oxide film as a gate insulating film in accordance with the present invention, formation of wedge-like oxide films at the edges of the gate region can effectively be prevented to manufacture a transistor of satisfactory electric property.

In particular, a MOSFET having an excellent long-time durability can be manufactured as compared with a conventionally employed MOSFET using silicon dioxide as a gate insulating film.

In particular, if the thickness of the gate insulating film is reduced in a W/SiO$_2$ structure, contamination with W to Si substrate can not be prevented to deteriorate the electron mobility. However, by using Ta$_2$O$_5$ as the gate insulating film, it is possible to manufacture a W gate MOSFET of excellent reliability without deteriorating the mobility.

Further, as the gate insulating film, it is possible to use, in addition to tantalum pentoxide, a film made of niobium oxide, yttrium oxide, hafnium oxide, zirconium oxide or titanium oxide, or a laminated film comprising them in stack or a film comprising a mixture of them, by which similar effects to those obtained by using the tantalum pentoxide film can also be obtained.

What is claimed is:

1. A method of manufacturing a semiconductor device comprising the following steps:
   (a) a step of forming a first insulating film on a main surface of a semiconductor substrate, the first insulating film being a laminate of a first layer of an oxide of material of the semiconductor substrate, and a second oxide layer, the second oxide layer being formed of an oxide selected from the group consisting of tantalum pentoxide, niobium oxide, yttrium oxide, hafnium oxide, zirconium oxide and titanium oxide, the first layer being formed by applying a heat treatment to the semiconductor substrate in a dry oxidizing atmosphere,
   (b) a step of laminating a conductive film of a material selected from the group consisting of tungsten and molybdenum on said first insulating film,
   (c) a step of removing an unnecessary portion of said conductive film thereby forming a gate electrode and exposing the surface of said first insulating film extending beyond edges of the gate electrode, and
   (d) while the first insulating film extends beyond the edges of the gate electrode, a step of implanting impurity ions into predetermined surface regions of said semiconductor substrate, thereby forming source and drain regions.

2. A manufacturing method as defined in claim 1, wherein a second insulating film is laminated on the conductive film, and ion implantation of the impurity is conducted after removing unnecessary portions of said second insulating film and said conductive film.

3. A manufacturing method as defined in claim 3, wherein the second insulating film has substantially the same shape and substantially the same size as those of the conductive film.

4. A manufacturing method as defined in claim 3, wherein the ion implantation is conducted by using the second insulating film as a mask.

5. A manufacturing method as defined in claim 3, wherein a third insulating film is provided on the sides of the conductive film and the second insulating film after the ion implantation, by steps of forming a layer of material of the third insulating film overlying the semiconductor substrate and anisotropically etching the layer of material so as to form the third insulating film, and the impurity ions are further implanted thereby increasing the depth at a portion of the source and drain regions.

6. A manufacturing method as defined in claim 5, wherein the lower end of the third insulating film is formed on the first insulating film.

7. A manufacturing method as defined in claim 5, wherein each of the second and third insulating films are formed by deposition of material, respectively, of the second and third insulating films.

8. A manufacturing method as defined in claim 3, wherein a third insulating film is provided on the sides of the conductive film and the second insulating film, by steps of forming a layer of material of the third insulating film overlying the semiconductor substrate and anisotropically etching the layer of material so as to form the third insulating film, and the ion implantation is conducted by using the second and the third insulating films as the mask.

9. A manufacturing method as defined in claim 8, wherein a fifth insulating film is provided on sides of the third insulating film, by steps of forming a layer of material of the fifth insulating film overlying the semiconductor substrate and anisotropically etching the layer of material of the fifth insulating film so as to form the fifth insulating film, and the ion implantation is conducted using the second, third and fifth insulating films as the mask.

10. A manufacturing method as defined in claim 9, wherein the step of implanting impurity ions is performed in two sub-steps, a first sub-step to form a first sub-region of a relatively low impurity concentration, the first sub-step being performed using the second and third insulating films as a mask, and a second sub-step to form a second sub-region that extends deeper from the main surface of the semiconductor substrate than does the first sub-region and that has a relatively large impurity concentration, the second sub-step being performed using the second, third and fifth insulating films as the mask.

11. A manufacturing method according to claim 10, wherein the second, third and fifth insulating films are provided using deposition of material for the respective insulating films.

12. A manufacturing method as defined in claim 8, wherein each of the second and third insulating films is formed by deposition of material, respectively, of the second and third insulating films.

13. A manufacturing method as defined in claim 3, wherein the second insulating film is formed by deposition of material of the second insulating film on the conductive film.

14. A manufacturing method as defined in claim 1, wherein the ion implantation is conducted without removing the first insulating film.

15. A manufacturing method as defined in claim 1, wherein the ion implantation is conducted after removing a portion of the first insulating film.

16. A manufacturing method as defined in claim 10, wherein the portion of the first insulating film is removed such that ends of the first insulating film situates to the outside of the edges of the conductive film.

17. A manufacturing method as defined in claim 1, wherein a fourth insulating film is formed on the surface of the semiconductor substrate exposed by the removal of the first insulating film and the ion implantation is conducted through the first and the fourth insulating films.

18. A manufacturing method as defined in claim 12, wherein the fourth insulating film is formed by depositing material of the fourth insulating film on the surface of the semiconductor substrate.

19. A manufacturing method as defined in claim 1, wherein the first conductivity type is p-type and the second conductivity type is n-type.

20. A manufacturing method as defined in claim 19, wherein the second oxide layer is a tantalum pentoxide film, and the tantalum pentoxide film is formed by reactive sputtering or chemical vapor deposition.

21. A manufacturing method as defined in claim 1, wherein the gate electrode is formed by removing an unnecessary portion of a polysilicon film highly doped with phosphorus by microwave plasma etching using $SF_6$.

22. A manufacturing method as defined in claim 1, wherein the impurity is arsenic.

23. A manufacturing method as defined in claim 19, wherein the oxide comprises at least one compound selected from the group consisting of niobium oxide, yttrium oxide, hafnium oxide, zirconium oxide and titanium oxide.

24. A manufacturing method as defined in claim 19, wherein the oxide is tantalum pentoxide.

25. A manufacturing method as defined in claim 20, wherein said laminate comprises a silicon dioxide layer and a tantalum pentoxide layer, said silicon dioxide layer is formed between said tantalum pentoxide layer and said semiconductor substrate by forming said tantalum pentoxide layer and, subsequently, applying thermal oxidation to the surface of said semiconductor substrate in the dry oxidizing atmosphere.

26. A manufacturing method as defined in claim 20, wherein the step of implanting impurity ions is performed through exposed portions of said first insulating film.

27. A manufacturing method as defined in claim 20, comprising the further step of removing an unnecessary portion of the tantalum pentoxide layer, leaving a part of the first insulating film extending beyond the edges of the gate electrode, and wherein the unnecessary portion of the tantalum pentoxide layer is removed by reactive sputter etching using $CHF_3$ as an etching gas.

28. A manufacturing method as defined in claim 1, wherein the step of implanting impurity ions is performed through exposed portions of said first insulating film.

29. A manufacturing method as defined in claim 1, wherein the step of implanting impurity ions is performed after the step of removing an unnecessary portion of said conductive film, and wherein the step of implanting impurity ions is performed without a thermal oxidation being performed between said step of removing and said step of implanting impurity ions.

30. A manufacturing method as defined in claim 1, wherein said laminate includes silicon dioxide layers sandwiching said second oxide layer.

31. A manufacturing method as defined in claim 19, wherein the step of removing an unnecessary portion of the conductive film includes sub-steps of (a) laminating a layer of material for forming a mask, on said conductive film, (b) removing an unnecessary portion of said layer of material for forming a mask, to thereby form the mask, portions of the conductive film being exposed through the mask; and (c) removing exposed portions of the conductive film to thereby form the gate electrode and expose the surface of the first insulating film extending beyond edges of the gate electrode, and wherein the mask is retained on the gate electrode during the step of implanting impurity ions.

32. A manufacturing method as defined in claim 1, wherein said semiconductor substrate is of a first conductivity type, and the impurity ions are of a second conductivity type opposite to the first conductivity type.

33. A manufacturing method as defined in claim 1, wherein said semiconductor substrate includes silicon, and the oxide of material of the semiconductor substrate is silicon oxide.

34. A manufacturing method as defined in claim 33, wherein the step of forming the first insulating film includes a first sub-step of depositing the second oxide layer on the main surface of the semiconductor substrate and a second sub-step of applying the heat treatment in the dry oxidizing atmosphere.

35. A manufacturing method as defined in claim 34, wherein the second sub-step is performed subsequent to the first sub-step.

36. A manufacturing method as defined in claim 42, wherein said semiconductor substrate is of a first conductivity type, and the impurity ions are of a second conductivity type opposite to the first conductivity type.

37. A manufacturing method as defined in claim 33, wherein, after forming said first insulating film, a stacked film of said gate electrode and a second insulating film is formed.

38. A manufacturing method as defined in claim 37, wherein the step of implanting impurity ions is performed using the second insulating film as a mask.

39. A method of manufacturing a semiconductor device comprising the following steps:
 (a) a step of forming a first insulating film comprising a laminate, the laminate including a silicon oxide layer and an oxide layer formed of an oxide selected from the group consisting of tantalum pentoxide, niobium oxide, yttrium oxide, hafnium oxide, zirconium oxide and titanium oxide, on the main surface of a semiconductor substrate, the silicon oxide layer being formed by applying a heat treatment to the semiconductor substrate in a dry oxidizing atmosphere,
 (b) a step of laminating a conductive film of a material selected from the group consisting of tungsten and molybdenum on said first insulating film,
 (c) a step of removing an unnecessary portion of said conductive film thereby forming a gate electrode and exposing the surface of said first insulating film extending beyond edges of the gate electrode, and
 (d) while the first insulating film extends beyond the edges of the gate electrode, a step of implanting impurity ions into predetermined surface regions of said semiconductor substrate, thereby forming source and drain regions.

40. A manufacturing method as defined in claim 37, wherein said semiconductor substrate is of a first conductivity type, and the impurity ions are of a second conductivity type opposite to the first conductivity type.

41. A manufacturing method as defined in claim 37, wherein the step of forming the first insulating film includes a first sub-step of depositing the oxide layer on the main surface of the semiconductor substrate and a second sub-step of applying the heat treatment in the dry oxidizing atmosphere.

42. A manufacturing method as defined in claim 46, wherein said semiconductor substrate is of a first conductivity type, and the impurity ions are of a second conductivity type opposite to the first conductivity type.

* * * * *